United States Patent
Shoolman et al.

(10) Patent No.: US 9,984,106 B2
(45) Date of Patent: *May 29, 2018

(54) SYSTEMS, METHODS, AND MEDIA FOR MANAGING AN IN-MEMORY NOSQL DATABASE

(71) Applicant: Redis Labs Ltd., Tel Aviv (IL)

(72) Inventors: Yiftach Shoolman, Modi'in (IL); Ofer Bengal, Hod Hasharon (IL)

(73) Assignee: Redis Labs Ltd., Tel Aviv (IL)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/255,680

(22) Filed: Sep. 2, 2016

(65) Prior Publication Data
US 2016/0371268 A1    Dec. 22, 2016

Related U.S. Application Data

(63) Continuation of application No. 13/853,030, filed on Mar. 28, 2013, now Pat. No. 9,436,710, and a
(Continued)

(51) Int. Cl.
    G06F 7/02      (2006.01)
    G06F 17/30     (2006.01)
    H03M 7/30      (2006.01)

(52) U.S. Cl.
    CPC .... G06F 17/3033 (2013.01); G06F 17/30289 (2013.01); G06F 17/30321 (2013.01);
(Continued)

(58) Field of Classification Search
    CPC ......... G06F 17/30289; G06F 17/30321; G06F 17/30587; G06F 17/30; G06F 17/30318;
(Continued)

(56) References Cited

U.S. PATENT DOCUMENTS 7,420,992 B1   9/2008 Fang et al.
8,805,984 B2   8/2014 Markus et al.
(Continued)

OTHER PUBLICATIONS

DeCandia, G. et al., "Dynamo: Amazon's Highly Available Key-Value Store", In Proceedings of the Symposium on Operating Systems Principles (SOSP '07), Stevenson, WA, USA, Oct. 14-17, 2007, pp. 205-220.
(Continued)

*Primary Examiner* — Bruce M Moser
(74) *Attorney, Agent, or Firm* — Byrne Poh LLP

(57) ABSTRACT

Systems, methods, and media for managing an in-memory NoSQL database are provided. In some embodiments, systems for managing an in-memory NoSQL database are provided, the systems comprising a hardware processor that is configured to: identify a group of keys capable of being included in a complex multi-key database command, the group including a first key and a second key, the first key being associated with a first value and the second key being associated with a second value, the first value and the second value being stored on different servers that are part of the database; and cause the first value and the second value to be both stored on a given server.

18 Claims, 10 Drawing Sheets

Related U.S. Application Data continuation-in-part of application No. 13/247,371, filed on Sep. 28, 2011, now Pat. No. 8,972,488.

(60) Provisional application No. 61/802,062, filed on Mar. 15, 2013, provisional application No. 61/802,158, filed on Mar. 15, 2013, provisional application No. 61/616,426, filed on Mar. 28, 2012, provisional application No. 61/427,492, filed on Dec. 28, 2010, provisional application No. 61/387,255, filed on Sep. 28, 2010.

(52) U.S. Cl.
CPC .. *G06F 17/30575* (2013.01); *G06F 17/30587* (2013.01); *H03M 7/3088* (2013.01); *H03M 7/707* (2013.01)

(58) Field of Classification Search
CPC ........... G06F 17/3033; G06F 17/30312; G06F 17/30283
See application file for complete search history.

(56) References Cited

U.S. PATENT DOCUMENTS

| | | |
|---|---|---|
| 8,943,166 B2 | 1/2015 | Ito et al. |
| 9,015,345 B2 | 4/2015 | O'Shea et al. |
| 2006/0059253 A1 | 3/2006 | Goodman et al. |
| 2007/0106666 A1 | 5/2007 | Beckerle et al. |
| 2007/0226203 A1 | 9/2007 | Adya et al. |
| 2008/0215602 A1 | 9/2008 | Samson et al. |
| 2008/0235292 A1 | 9/2008 | Janin et al. |
| 2009/0119321 A1 | 5/2009 | Mitran |
| 2010/0153466 A1 | 6/2010 | Burger |
| 2010/0185593 A1 | 7/2010 | Wong et al. |
| 2010/0318498 A1 | 12/2010 | Swarnakar et al. |
| 2011/0022575 A1 | 1/2011 | Tomkins |
| 2011/0258179 A1 | 10/2011 | Weissman et al. |
| 2012/0054197 A1* | 3/2012 | San Martin ....... G06F 17/30486 707/747 |
| 2012/0078974 A1* | 3/2012 | Meijer ............... G06F 17/30595 707/803 |
| 2012/0117054 A1 | 5/2012 | Shrinivas et al. |
| 2012/0284317 A1 | 11/2012 | Dalton |
| 2013/0103658 A1* | 4/2013 | Travis ............... G06F 17/30551 707/700 |

OTHER PUBLICATIONS

IBM, "A System of Reducing Down Time in a Cached In-Memory Database Environmental Using Checkpointing Mechanism", IP.Com Prior Art Database Technical Disclosure, Apr. 14, 2009, pp. 1-4.
Notice of Allowance dated Jul. 11, 2016 in U.S. Appl. No. 13/853,030.
Notice of Allowance dated Jul. 23, 2013 in U.S. Appl. No. 13/247,263.
Notice of Allowance dated Oct. 1, 2014 in U.S. Appl. No. 13/853,011.
Notice of Allowance dated Nov. 14, 2014 in U.S. Appl. No. 13/247,371.
Office Action dated Aug. 4, 2014 in U.S. Appl. No. 14/064,891.
Office Action dated Aug. 10, 2015 in U.S. Appl. No. 14/064,891.
U.S. Appl. No. 13/853,011, filed Mar. 28, 2013, pgpub 20130232177.
Notice of Allowance dated Apr. 10, 2017 in U.S. Appl. No. 14/064,891.
Office Action dated Jan. 26, 2015 in U.S. Appl. No. 13/853,030.
Office Action dated Jul. 21, 2017 in U.S. Appl. No. 14/590,679.
Wikipedia, "Gossip Protocol", last accessed Mar. 20, 2017, pp. 1-6, available at: https://en.wikipedia.org/wiki/Gossip_protocol.

* cited by examiner

SYSTEMS, METHODS, AND MEDIA FOR MANAGING AN IN-MEMORY NOSQL DATABASE

STATEMENT REGARDING RELATED APPLICATIONS

The following applications are hereby incorporated by reference herein in their entireties: U.S. patent application Ser. No. 13/853,030, filed Mar. 28, 2013; U.S. Provisional Patent Application No. 61/802,062, filed Mar. 15, 2013; U.S. Provisional Patent Application No. 61/802,158, filed Mar. 15, 2013; U.S. Provisional Patent Application No. 61/616,426, filed Mar. 28, 2012; U.S. patent application Ser. No. 13/247,371, filed Sep. 28, 2011; U.S. Provisional Patent Application No. 61/387,255, filed Sep. 28, 2010; and U.S. Provisional Patent Application No. 61/427,492, filed Dec. 28, 2010.

BACKGROUND

Many Web 2.0 and Software as a Service (SaaS) applications rely heavily on user-created content. This reliance drives the need for (a) efficient and reliable scaling technologies for supporting rapid data growth; and (b) better storage and retrieval technology. Much of this user-created content only requires a primary key for store and retrieve commands rather than complex querying and management functionality offered by traditional Relational Database Management Systems (RDBMS's). The excess RDBMS functionality involves expensive hardware and highly skilled personnel, typically making it unsuitable for these types of applications. In-addition, RDBMS replication capabilities are limited and typically prefer consistency over performance and availability. Despite many developments in recent years, scaling-out a relational database is still very complex.

During recent years NoSQL (Not Only SQL) database management systems (which are also referred to as non-relational databases or unstructured databases) have emerged in-order to solve these RDBMS deficiencies. NoSQL is a broad class of database management systems that can differ from classic RDBMS in some significant ways: (1) there are no inherent relations between stored objects; (2) the data stores may not require fixed table schemas; and (3) NoSQL avoids join operations and typically scales horizontally.

In-memory non-relational databases are subset of NoSQL databases, and are designed in a way that all of (or a major part of) the users' dataset is stored in RAM Memory. In memory NoSQL databases (i.e., NoSQL databases entirely served from RAM) have become popular among developers for their ability to improve application performance and reduce operational costs. Benchmarks have shown that in-memory NoSQL databases can be up to 100 times faster than HDD-based NoSQL databases and 10-20 times faster than SSD-based NoSQL databases.

The performance of in-memory NoSQL databases, however, can suffer when the databases are implemented in a distributed fashion where database data structures are spread over multiple nodes. In such implementations, the execution of complex multi-key commands, such as UNION, INTERSECT, and SORT, may require migrating objects across nodes and even blocking database operation in-order to ensure data consistency. The delays resulting from object migration and operation blocking may be especially harmful to the performance of in-memory NoSQL databases, such as Redis, that are expected to execute commands at sub-millisecond latency.

Accordingly, the need exists for systems, methods, and media for managing an in-memory NoSQL database.

SUMMARY

Systems, methods, and media for managing an in-memory NoSQL database are provided. In some embodiments, systems for managing an in-memory NoSQL database are provided, the systems comprising a hardware processor that is configured to: identify a group of keys capable of being included in a complex multi-key database command, the group including a first key and a second key, the first key being associated with a first value and the second key being associated with a second value, the first value and the second value being stored on different servers that are part of the database; and cause the first value and the second value to be both stored on a given server.

In some embodiments, methods for managing an in-memory NoSQL database are provided, the methods comprising: identifying, by a hardware processor, a group of keys capable of being included in a complex multi-key database command, the group including a first key and a second key, the first key being associated with a first value and the second key being associated with a second value, the first value and the second value being stored on different servers that are part of the database; and causing the first value and the second value to be both stored on a given server.

In some embodiments, non-transitory computer-readable media containing computer-executable instructions that, when executed by a processor, cause the processor to perform a method for managing an in-memory NoSQL database are provided, the method comprising: identifying a group of keys capable of being included in a complex multi-key database command, the group including a first key and a second key, the first key being associated with a first value and the second key being associated with a second value, the first value and the second value being stored on different servers that are part of the database; and causing the first value and the second value to be both stored on a given server.

DETAILED DESCRIPTION

Systems, methods, and media for providing in-memory NoSQL cluster with complex data structures are provided.

Figure 1:
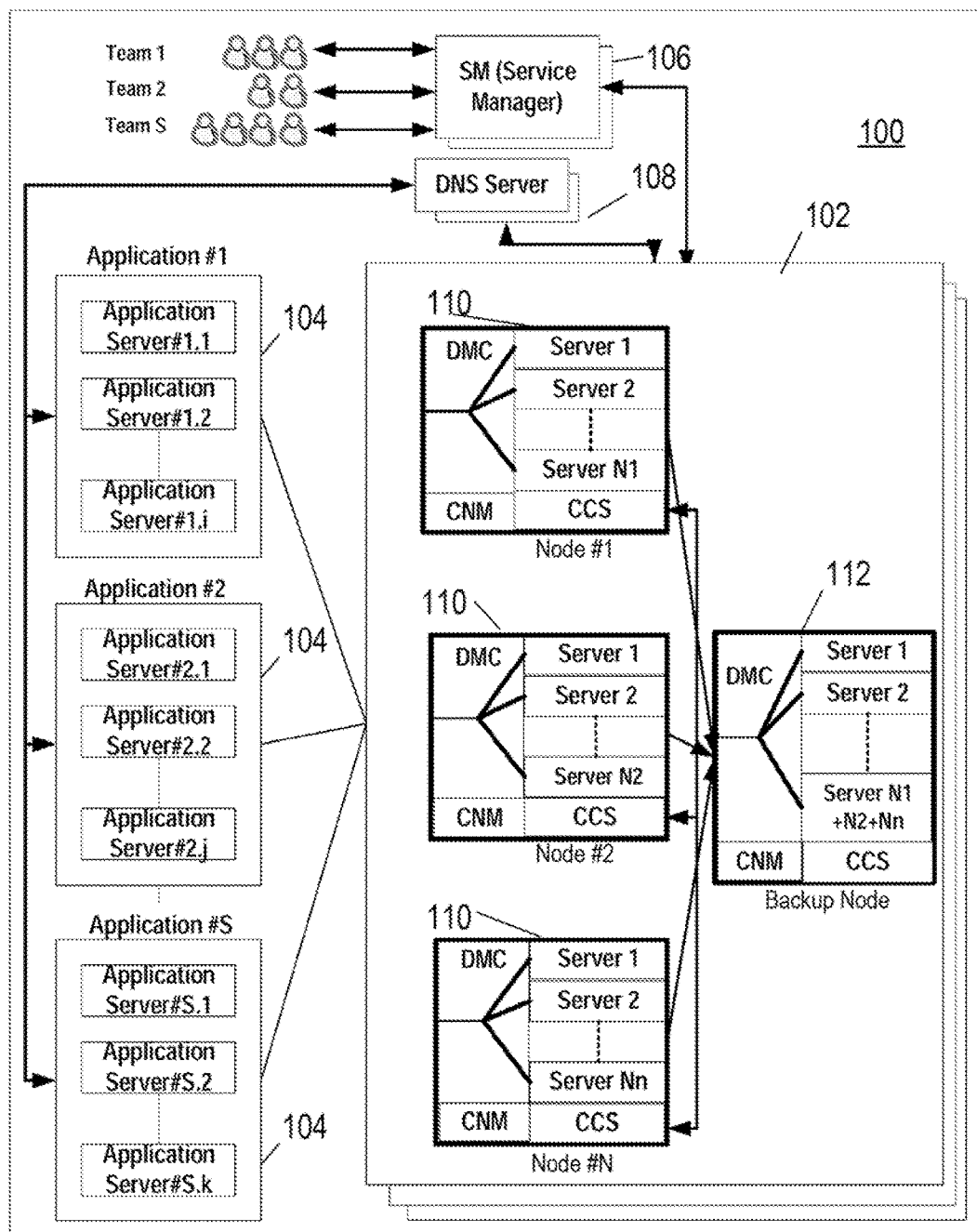
FIG. 1 is a diagram of an example of a cluster architecture in accordance with some embodiments.

In accordance with some embodiments, an in-memory non-relational database can be implemented as a system 100 as illustrated in FIG. 1. As shown, system 100 can include one or more clusters 102, one or more applications 104, one or more service managers 106, and one or more domain name servers 108. Clusters 102 can be one or more clusters of nodes 110 for providing in-memory data storage as well as related functionality as described further below. Applications 104 can be one or more applications that use data and related information stored in nodes 102. Service manager (SM) 106 can be an entity that manages the user interaction with the system, as well as maps user configuration to cluster resources. The SM can be designed to support single- and multi-tenancy modes of operation, and can allow the system to be supplied as a service. The SM can also communicate with a cluster node manager of a node (described below) for aggregating service statistics and alarms. When deployed as a service, the SM can also be responsible for usage reports and billing. DNS 108 can provide a mechanism for domain name server functions as known in the art.

Figure 2:
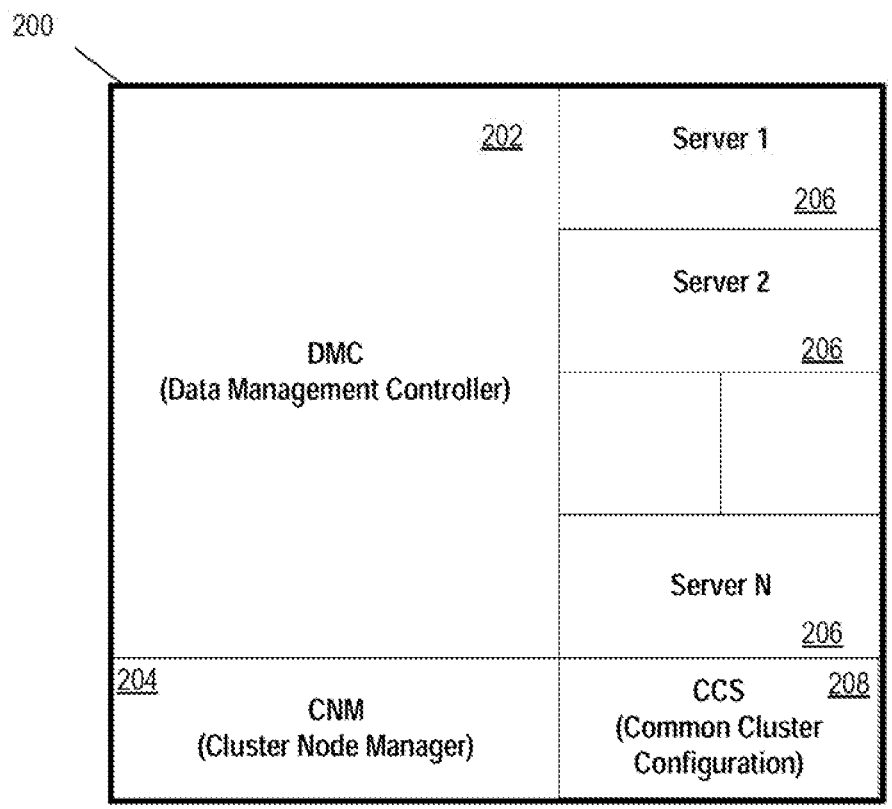
FIG. 2 is a diagram of an example of a node architecture in accordance with some embodiments.

Turning to FIG. 2, an example of a node 200 that can be used as a node 110 in a cluster 102 in accordance with some embodiments is illustrated. As shown, node 200 can include a data management controller (DMC) 202, a cluster node manager (CNM) 204, zero or more servers 206, and a common cluster storage 208. As described more fully below, in some embodiments, server(s) 206 can be used to provide in-memory non-relational database functionality. In some embodiments, the server(s) can be based on the open-source Redis server with enhanced functionality. In some embodiments, the server(s) can represent one of the following options: (1) a Memcached Bucket; (2) a partition of a Memcached Bucket; (3) a Redis database (DB); or (4) a partition of a Redis DB.

In some embodiments, node 200 may be implemented using physical hardware, such as a computer and/or a blade server. Additionally or alternatively, in some embodiments, node 200 may be implemented as a virtual server in a virtual environment, such as a computer cloud. In some embodiments, DMC 202 and CNM 204 may be implemented as one or more processes that are executed on node 200. Additionally or alternatively, in some embodiments, DMC 202 and CNM 204 may be implemented as one or more processes that are executed on a device other than a device on which other components of node 200 are executed. Any suitable system topology may be used, in some embodiments. Any suitable system topology may be used, in some embodiments.

In some embodiments, each of servers 206 may be implemented as one or more software processes that are executed on node 200. Moreover, in some embodiments, any of servers 206 may be implemented in 32-bit computer software instead of 64-bit software. Because the size of a word in 32-bit software is half the size of a 64-bit word, using 32-bit computer software may cause a decrease in memory overhead resulting from the use of pointers (which are one word in size). Regardless of whether any of servers 206 are implemented in 32-bit software or 64-bit software, servers 206 may be executed on 64-bit hardware (e.g., executed by a 64-bit hardware processor). Although servers 206 are depicted as processes executed on the same node, in some embodiments, one or more of servers 206 may be executed one or more different devices than the rest of servers 206.

In some embodiments, complex data structures, such as skip lists and linked lists, may include large numbers of pointers for each value stored in them in order to permit commands, such as search, intersect, or union, to be executed. The large numbers of pointers may result in a significant memory overhead. For example, as illustrated in FIG. 5, elements in a skip list 500 (when skip list 500 is implemented using 64-bit software) may have 4-byte values, with each 4-byte value being associated with 3 pointers (24 bytes in total). Thus, in some instances, the overhead costs introduced by the management of pointers may reach 87.5% (including memory alignment overhead).

In some embodiments, this overhead may be reduced by implementing one or more of servers 206 in 32-bit software. Using servers implemented in 32-bit software may reduce the memory overhead by half without causing any significant loss of performance and/or functionality, as compared to servers implemented in 64-bit software. As noted above, in embodiments in which servers 206 are implemented in 32-bit computer software, pointers can be only 4-bytes in size, rather than 8 bytes as is the case with 64-bit architectures. This can represent a 50% savings in memory overhead for every stored object.

In some aspects, servers running on 32-bit software architectures may run out of memory faster than those servers that are implemented in 64-bit software. The memory address space of 32-bit servers may include 4096 billion different addresses, whereas the memory space available in 64-bit architectures may be virtually unlimited (e.g., it may include $1.8 \times 10^{19}$ addresses). Thus, 32-bit servers may be much more likely to run out of available memory space than their 64-bit counterparts when deployed in a data-intensive setting. Accordingly, as is discussed further below, techniques for rebalancing the data that is stored on servers may be deployed that prevent the servers from running out of available memory addresses when the servers are implemented using low-bit (e.g., 32-bit) software.

In some embodiments, DMC 202 and/or CNM 204 may be used to implement a database (or bucket) that is hosted on a plurality of servers (e.g., servers 206). Any suitable type of servers may be used to implement the database. The database may include low-bit servers only (e.g., servers that are implemented in 32-bit software or otherwise have a smaller address space than high-bit servers), high-bit servers only (e.g., servers having a larger address space than the low-bit servers, such as 64-bit servers), or any suitable combination of low-bit and high-bit servers (e.g., a combination of 32-bit servers and 64-bit servers executed on 64-bit processors).

DMC 202 and/or CNM 204 may implement an intermediate layer that is used to organize the database into partitions. The intermediate layer may be situated between applications that use the database and the plurality of servers. The intermediate layer may be transparent to both client applications that use the database and to the servers that host the database.

Each partition may be a logical unit that includes a plurality of database data values. The number of partitions in a database may be fixed throughout the life of the database, in some embodiments. The size of the partitions may be variable, in some embodiments. Whether a data structure belongs to a given partition may depend on whether a key associated with the database data structure is mapped (e.g., by a hashing function and/or a mapping structure) to an ID of given the partition. Servers that host the database may store multiple partitions or only one partition. When the address space capacity of servers becomes close to being reached, new servers may be instantiated, and partitions stored in the latter servers may be relocated to the new servers. The implementation and use of partitions is discussed in further detail in U.S. patent application Ser. No. 13/853,011, filed Mar. 28, 2013, and entitled "SYSTEMS, METHODS, AND MEDIA FOR MANAGING RAM RESOURCES FOR IN-MEMORY NOSQL DATABASES" (hereinafter "the '011 application"), which is hereby incorporated by reference herein in its entirety.

In some embodiments, data that is stored in the database may be organized in key-value pairs. In some embodiments, each key-value pair may be a database object. The key of each pair may be any symbol, letter, digit, number, string, and/or any other suitable information representation that is usable to retrieve the same pair's data structure from the database. The value of each pair may be a digit, a string, a number, a hash, a linked list, a data structure, and/or any other suitable information representation. Any suitable implementation of database data objects may be used in some embodiments. In some embodiments, a database data structure (or a value that is part of the data structure) may be considered to be associated with a key, if that key is usable to retrieve the data structure's value from the database. Additionally or alternatively, in some embodiments, a database data structure may be considered to be associated with a key, if that key references the data structure.

In some embodiments, DMC 202 may assign database values that tend to be requested by the same complex multi-key commands on the same server in the database. In some embodiments, a complex multi-key operation may be an operation that requires the database to combine and/or compare the values associated with each of the keys specified by the complex multi-key operation. Examples of complex multi-key operations include the UNION and INTERSECT commands. As noted above, complex multi-key operations may have increased latency (as compared to other operations) because they may require data to be accessed on multiple servers and provided to the server that ultimately executes the complex multi-key operations. Thus, by grouping database values that tend to be referenced together in complex-multi-key operations, a decrease in the latency of these operations may be achieved.

Figure 3:
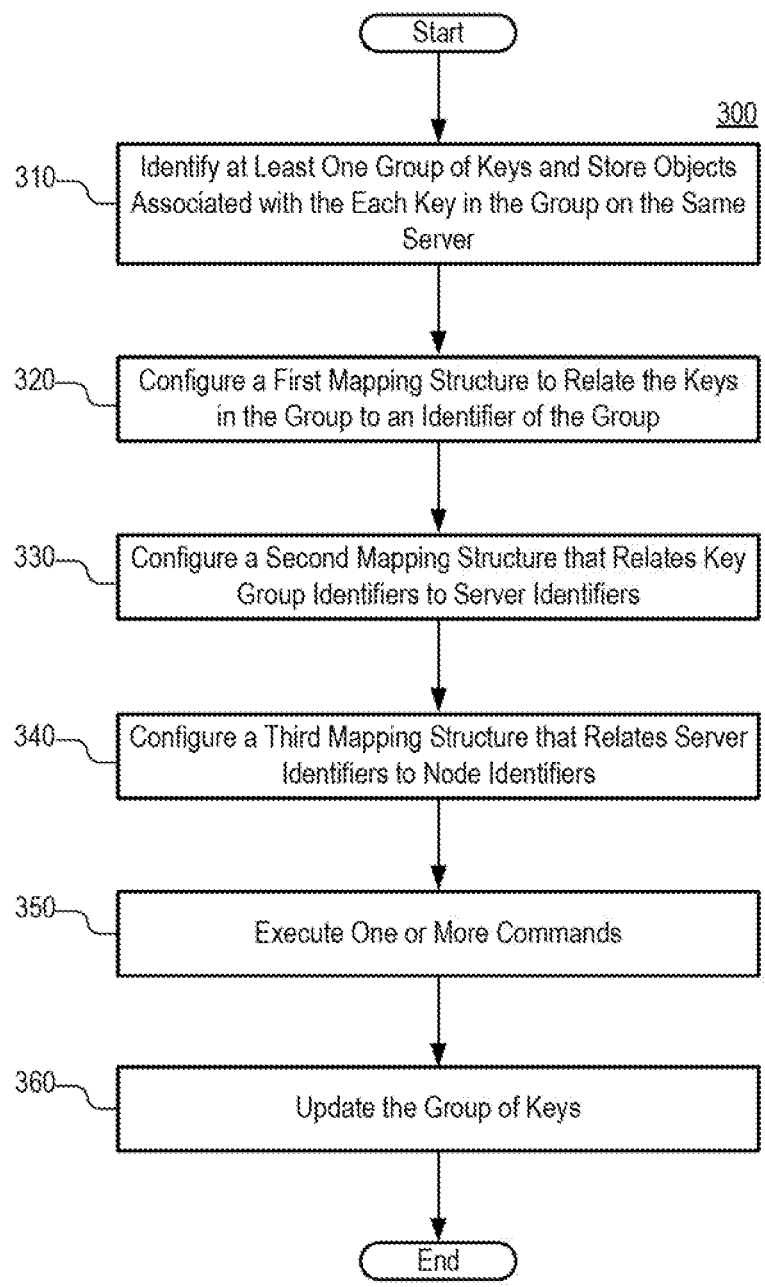
FIG. 3 is a diagram of an example of a process for managing a database in accordance with some embodiments.

FIG. 3 is a diagram of an example of a process 300 for managing a database in accordance with some embodiments of the disclosed subject matter. In some embodiments, process 300 may be executed by DMC 200 and/or by any other suitable component of the database and/or of node 200.

At 310, database values that are likely to be referenced together by complex multi-key commands are identified and stored on the same server. More particularly, in some embodiments, a group of two or more keys is identified and database values associated with the keys in the group are caused to be stored on the same server. Examples of processes for identifying the group of keys are provided with respect to FIGS. 4A-4C.

At 320, a first mapping structure that relates keys to group IDs (i.e., IDs of groups of keys) is configured. Configuring the first mapping structure may include one or more of: instantiating the first mapping structure, updating the first mapping structure, and/or performing any other suitable action. Any of the group IDs may include a number, a string, an alphanumerical string, and/or any other suitable type of identifiers. In some embodiments, for example, the first mapping structure may include a table that relates a set of keys with an ID for a group the keys in the set are considered to be part of. Additionally or alternatively, in some embodiments, the first mapping structure may include a regular expression that defines a group of keys. Thus, the first mapping structure may include data (e.g., a table), executable code, a hash function, and/or any suitable type of function and/or information that is usable to identify the ID of a group that a given key is part of. In some embodiments, the first mapping structure may be configured to relate the keys in the group identified at step 310 to an ID of the group.

At 330, a second mapping structure is configured that relates group IDs to server IDs. The second mapping structure may include data (e.g., a table), executable code, a hash function, and/or any suitable type of function and/or information that is capable of being used to identify a server ID that is associated with a given group ID. Any suitable implementation of the second mapping structure may be used in some embodiments. For example, the second mapping structure may be implemented as a table that relates group IDs to server IDs. Configuring the second mapping structure may include one or more of: instantiating the mapping structure, updating the mapping structure, and/or performing any other suitable action. Any of the server IDs may include a number, a string, an alphanumerical string, and/or any other suitable type of identifiers. In some embodiments, the second mapping structure may be configured to relate the ID of the group of keys that is identified at step 310 to the server where values associated with keys from the group are relocated.

Additionally or alternatively, in some embodiments, the second mapping structure may be configured to relate a group ID to a partition ID. The second mapping structure may include data (e.g., a table), executable code, a hash function, and/or any suitable type of function and/or information that is capable of being used to identify a partition ID that is associated with a given group ID. Any suitable implementation of the second mapping structure may be used in some embodiments. In some embodiments, the second mapping structure may be implemented as a table that relates group IDs to partition IDs. Configuring the second mapping structure may include one or more of: instantiating the mapping structure, updating the mapping structure, and/or performing any other suitable action. Any of the partition IDs may include a number, a string, an alphanumerical string, and/or any other suitable type of identifiers. In some embodiments, for any one of the groups of keys identified in the first mapping structure, the second mapping structure may identify a partition ID that is associated with that group of keys. In some embodiments, data corresponding to a partition may include a hashing function that maps group IDs to partition IDs. For example, the hashing function may be one that maps a space of Group IDs to a space of partition IDs.

At 340, a third mapping structure is configured that relates server IDs to node IDs. The third mapping structure may include data (e.g., a table), executable code, and/or any suitable type of information that is capable of being used to identify a node ID that is associated with a given server ID.

In some embodiments, the third mapping structure may be implemented as a table that relates server IDs to node IDs. Any suitable implementation of the third mapping structure may be used in some embodiments. Configuring the third mapping structure may include one or more of: instantiating the mapping structure, updating the mapping structure, and/or performing any other suitable action. Any of the server IDs may include a number, a string, an alphanumerical string, and/or any other suitable type of identifiers. In some embodiments, for any one of the plurality of servers that are used to host the database, the third mapping structure may identify a node (e.g., physical hardware, such as a computer and/or a blade server, and/or a virtual server in a virtual environment, such as a computer cloud) on which the server is executing.

At 350, one or more database commands are executed. Examples of processes for executing commands are provided in relation to FIGS. 5A-5C. Further examples of processes for executing commands are also provided in the '011 application.

At 360, the group of keys that is identified at step 310 is updated. Updating the group of keys may include adding one or more keys to the group and/or removing one or more keys from the group. Adding a key to the group of keys may include configuring the first mapping structure to associate the key with the ID of the group. Removing a key from the group may include modifying the first mapping structure to remove any associations between the key being removed and the ID of the group. Additionally or alternatively, in some embodiments, updating the group of keys may include deleting, from the first mapping structure, the ID of the group as well as any associations between the ID and keys in the group, and identifying a new group of keys in the manner discussed with respect to step 310. In some embodiments, the group of keys may be updated at predetermined time intervals (e.g., 10 minutes) and/or after the execution of a predetermined number of commands (e.g., 10 commands.).

Figure 4A:
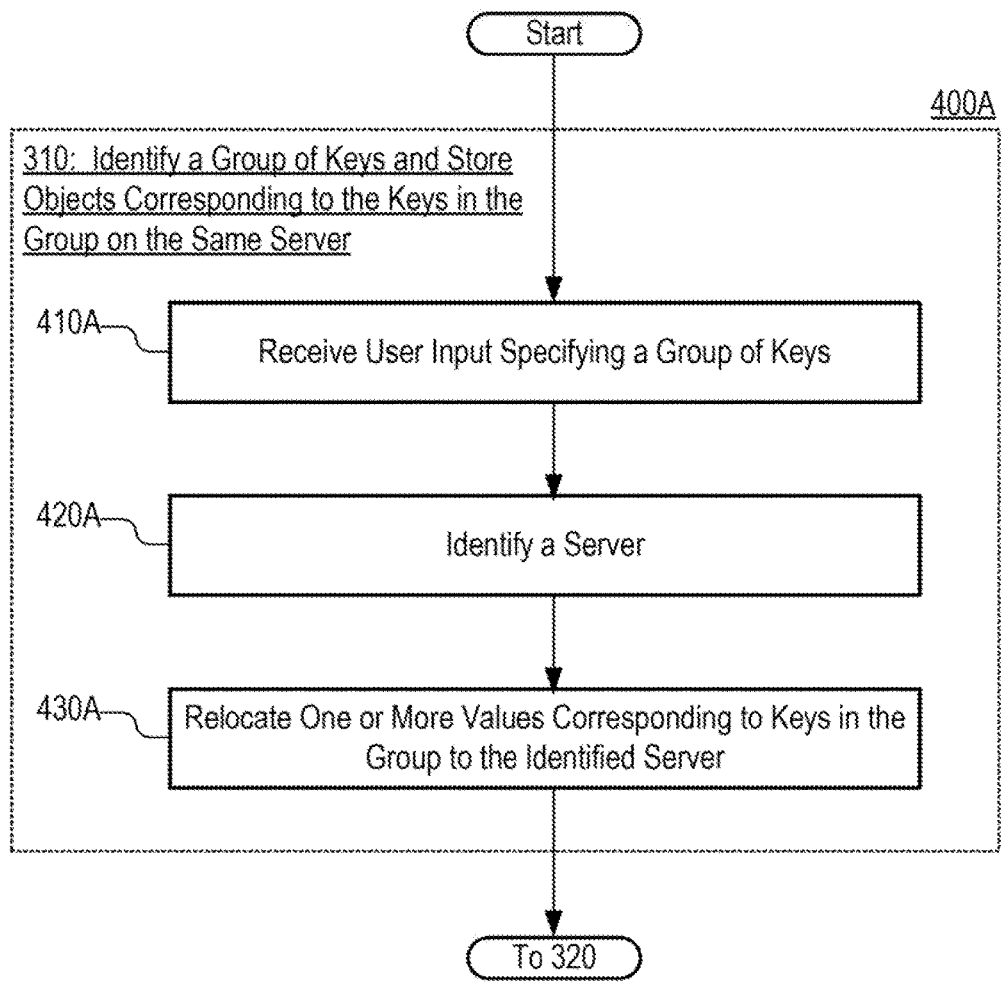
FIG. 4A is a diagram of an example of a process for identifying a group of keys in accordance with some embodiments.

FIG. 4A depicts a diagram of an example of a process 400A for identifying a group of keys in accordance with some embodiments of the disclosed subject matter. In some embodiments, process 400A may be used to identify a group of keys as specified by step 310 of process 300. Process 400A may be used additionally or alternatively to processes 400B and 400C (described herein) in some embodiments.

At 410A, a definition for a group of keys is obtained. In some embodiments, the definition may be received as user input via a local input device, such as a keyboard, or over a communications network. In some embodiments, the group definition may specify a symbol pattern. Keys associated with values in the database that match the specified pattern may be considered to belong to the group. In some embodiments, the group definition may include a regular expression and/or any other suitable type of expression. For example, a group of keys defined as "^user#[0-9]*" may include all keys that start with the string "user#" followed by at least one digit.

At 420A, a server is identified. Any suitable method for identifying the server may be used, in some embodiments. For example, in some embodiments, the server may be identified based on user input, based on a hash function of a group identifier, based on a predetermined rule, or based on any other suitable function, information, and/or criterion. Additionally or alternatively, in some embodiments, the identified server may be one in which a value associated with one of the keys in the group is already stored.

At 430A, at least some values stored in the database that are associated with different keys in the group are relocated to the identified server. Relocating the values may include, retrieving each value from its current location, storing the value on the identified server, and deleting the value from its current location, thus leaving a copy of the value on the identified server only. In some embodiments, the value retrieval and storage may be performed in accordance with the techniques discussed in the '011 application. As discussed above, storing values that are associated with keys from a group of keys may increase the speed at which complex multi-key commands are executed by the database.

Figure 4B:
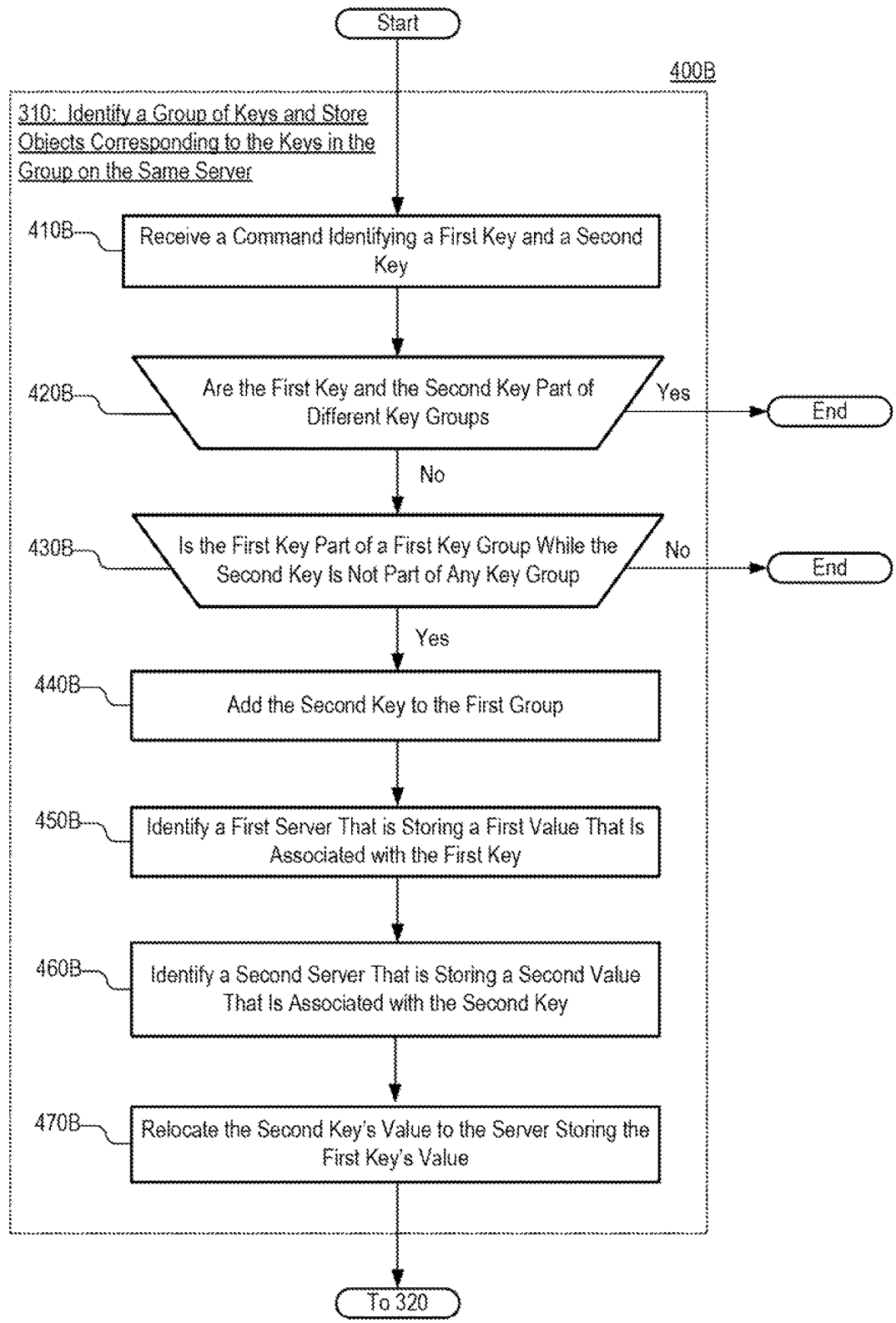
FIG. 4B is a diagram of another example of a process for identifying a group of keys in accordance with some embodiments.

FIG. 4B depicts a diagram of an example of a process 400B for identifying a group of keys in accordance with some embodiments of the disclosed subject matter. In some embodiments, process 400B may be used to identify a group of keys as specified by step 310 of process 300. Process 400B may be used additionally or alternatively to processes 400A and 400C (described herein) in some embodiments.

At 410B, a command is received that includes at least a first key and a second key. Any suitable type of command may be received, in some embodiments. For example, the command may be a UNION command, an INTERSECT command, or a SORT command.

At 420B, a determination is made whether the first key and the second key are assigned to different groups of keys. The determination may be performed based on the first mapping structure. If it is determined that the first key and the second key are assigned to different groups, the execution of process 400B terminates. Otherwise, the execution of process 400B proceeds to step 430B.

At 430B, a determination is made whether the first key is assigned to a first group. If it is determined that the first key is assigned to the first group of keys, process 400B proceeds to 440B. Otherwise, process 400B terminates.

At 440B, the second key is added to the first group. In some embodiments, adding the first key may include modifying the first mapping structure to relate the second key with the ID of the first group of keys.

At 450B, a first server that is hosting a first value that is associated with the first key is identified. In some embodiments, the first server may be identified by using techniques discussed in the '011 application.

At 460B, a second server that is hosting a second value that is associated with the first key is identified. In some embodiments, the second server may also be identified by using techniques discussed in the '011 application.

At 470B, the second value is relocated from the first server to the second server. Relocating the second database value may include copying the second database value to the server identified at 460B. In some embodiments, the relocation may be performed in the manner discussed with respect to step 310.

Figure 4C:
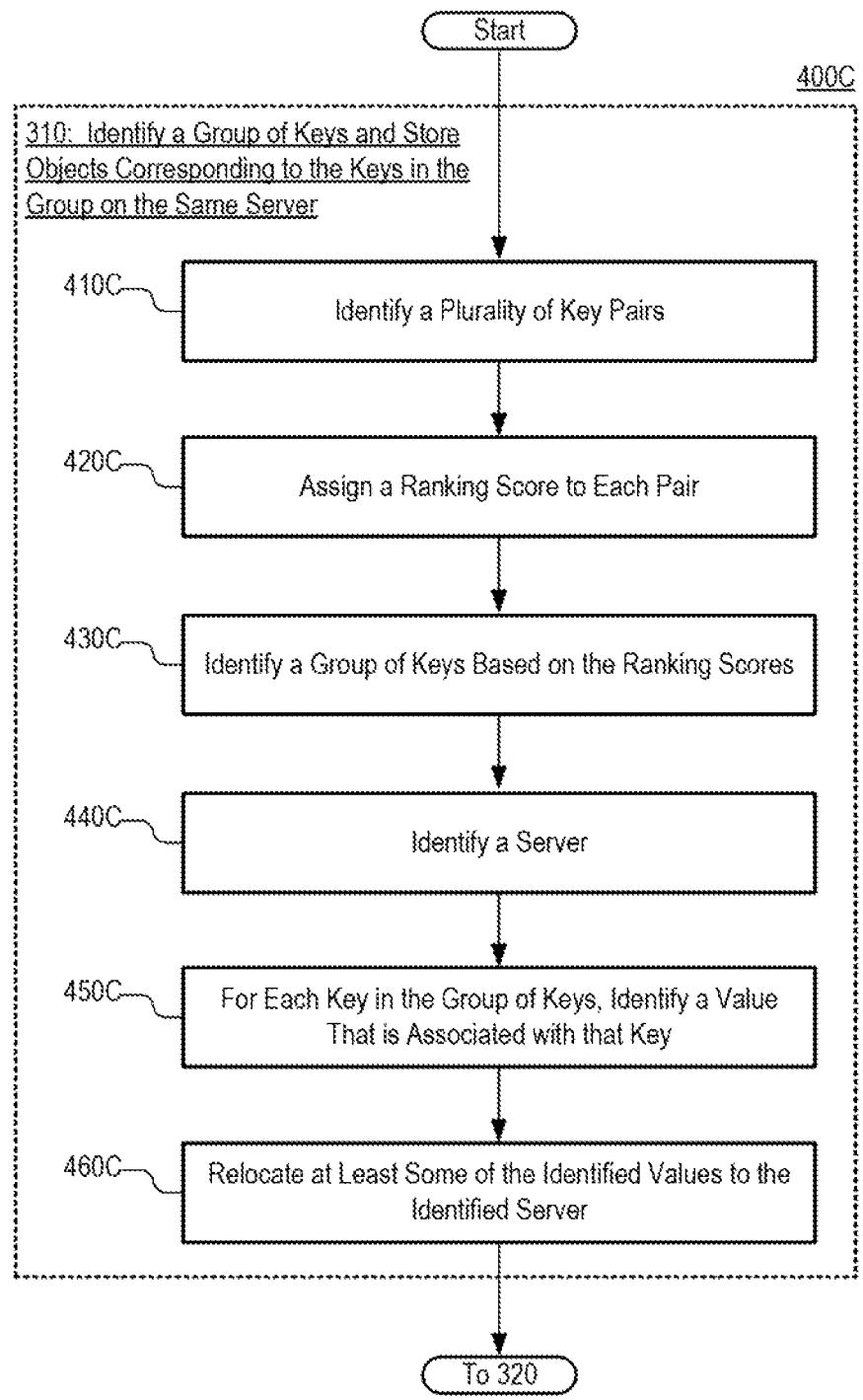
FIG. 4C is a diagram of yet another example of a process for identifying a group of keys in accordance with some embodiments.

FIG. 4C depicts a diagram of an example of a process 400C for identifying a group of keys in accordance with some embodiments of the disclosed subject matter. In some embodiments, process 400C may be used to identify a group of keys as specified by step 310 of process 300. Process 400C may be used additionally or alternatively to processes 400A and 400B (disclosed herein) in some embodiments.

At 410C, a plurality of key pairs is identified. Each pair may include a first key and a second key. Each first key and each second key may be associated with a different value that is stored in the database.

At 420C, a ranking score is assigned to each of the pairs. In some embodiments, the ranking score of each pair may be based on a count of commands that include both the pair's first key and the pair's second key that have been executed by the database. For example, the count may be based on the instructions executed during a predetermined period of time (e.g., in the last 10 minutes), on the number of instructions that include both keys in the set of N most recently-executed instruction, or based on any other suitable criterion. In some embodiments, the greater the count, the higher the ranking score. Any suitable type of instructions may be used to keep the count, in some embodiments. For example, the count may be based on INTERSECT instructions, UNION instructions, and/or any suitable type of instructions. Additionally or alternatively, the count may be based only on the number of complex multi-key instructions that have been invoked during the period.

At 430C, the pairs in the plurality are grouped based on their ranking scores to identify a group of keys. In some embodiments, the pairs may be grouped based on their ranking scores to determine a group of pairs. Once the group of pairs is determined, the keys from the pairs in the group may be included in the group of keys. In some embodiments, the keys may be grouped by identifying a subset of the plurality of pairs based on the pairs' ranking scores, and identifying a group of pairs from the subset, such that the first element in each pair of the group is also part of another pair in the group. The subset of the pairs may be identified by selecting all pairs whose ranking score exceeds a predetermined threshold or by selecting a subset of the plurality of pairs that have the highest ranking scores out of all pairs in the plurality. Any suitable method for identifying the subset of pairs may be used in some embodiments.

At 440C, a server is identified. The server may be identified in the manner discussed with respect to step 420A.

At 450C, for each key in the group of keys, a value associated with that key is identified. In some embodiments, the value may be identified by using techniques discussed in the '011 application.

At 460C, at least some of the values identified at step 450C are relocated to the server identified at 440C. The relocation may be performed in the manner discussed with respect to step 420A.

Figure 5A:
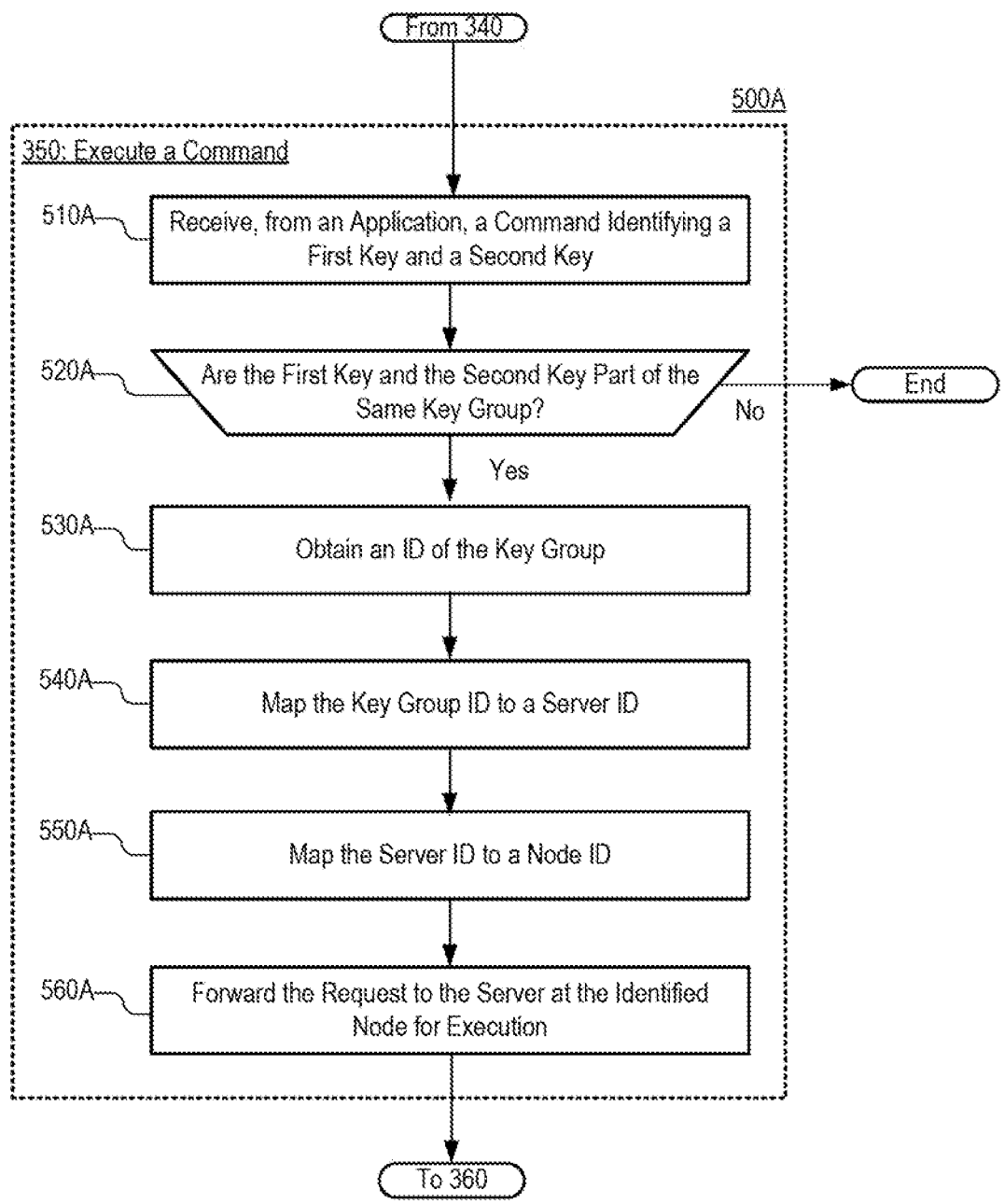
FIG. 5A is a diagram of an example of a process for executing database commands in accordance with some embodiments.

FIG. 5A depicts a diagram of an example of a process 500A for executing database commands in accordance with some embodiments of the disclosed subject matter. In some embodiments, process 500A may be used to execute one or more commands as specified by step 350 of process 300. Process 500A may be used additionally or alternatively to processes 500B and 500C (described herein) in some embodiments.

At 510A, a database command is received. Any suitable command may be received in some embodiments. For example, the command may be a SET command, a GET command, an INTERSECT command, a UNION command, and/or any other suitable type of command. The command may be received from any application and/or device that is capable of using the database.

At 520A, a determination is made whether the first key and the second key are part of the same group of keys. In some embodiments, the determination may be made by using the first mapping structure. If the first key and the second key are not part of the same group of keys, the execution of process 500A terminates. In such instances, the command may be executed using the technique(s) discussed in the '011 application. More specifically, for example, the first key may be mapped to a partition ID, the partition ID may be mapped to the ID of a server storing a value that is associated with the first key, and afterwards the server may be used, at least in part, to execute the instruction. Otherwise, if the first key and the second key are found to be part of the same group keys, process 500A proceeds to step 530A.

At 530A, the ID of the group of keys which the first key and the second key are part of is determined. In some embodiments, the ID of the group of keys may be determined by using the first mapping structure.

At 540A, the ID of the group of keys is mapped to a server ID in order to identify a server that is hosting values that are associated with keys from the group of keys. In some embodiments, the mapping may be performed based on the second mapping structure.

Additionally or alternatively, in some embodiments, the ID of the group of keys (or an expression (or portion thereof), such as a regular expression, matching keys from the group) may be mapped to a partition ID (e.g., by using the second mapping structure, such as a hash function). Afterwards, the partition ID may be used to identify a server ID. Each partition may be a logical unit that includes a plurality of database data values. Further discussion of the implementation and use of partitions is provided in the '011 application. In some embodiments the mapping of the ID of the group of keys to the partition ID may be performed by using the second mapping structure. As discussed above, in some embodiments, the second mapping structure may include (or implement) a hashing function.

At 550A, the server ID is mapped to a node ID in order to identify the node (e.g., a physical device, such as a computer, or a virtual machine) that is hosting the server. In some embodiments, the mapping may be performed based on the third mapping structure.

At 560A, the command is forwarded to the server hosting the values associated with keys in the group of keys and subsequently executed by that server. In some embodiments, a response to the command may be received form the first server and forwarded to the application and/or device that transmitted the command.

Figure 5B:
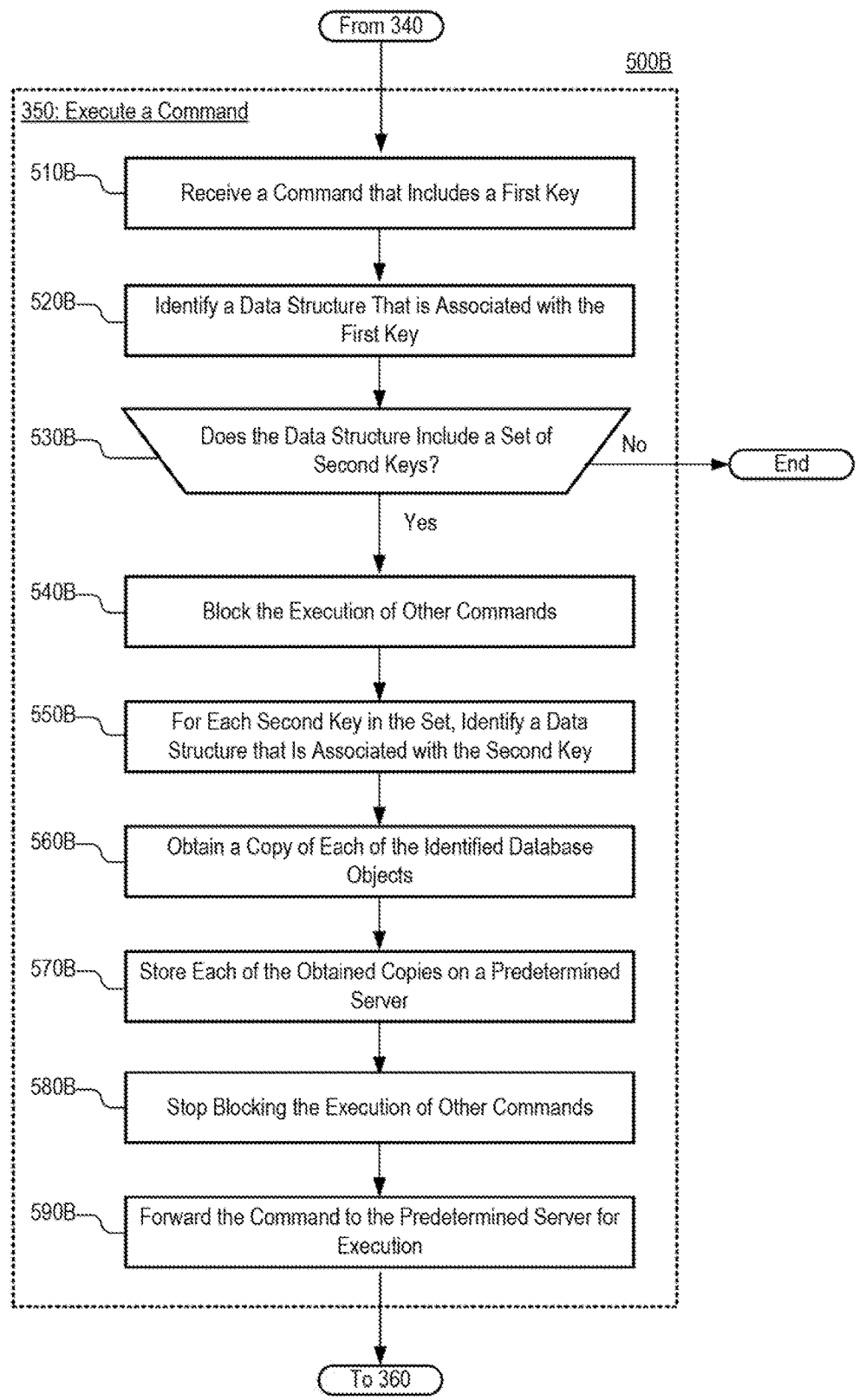
FIG. 5B is a diagram of another example of a process for executing database commands in accordance with some embodiments.

FIG. 5B depicts a diagram of an example of a process 500B for executing database commands in accordance with some embodiments of the disclosed subject matter. In some embodiments, process 500B may be used to execute one or more commands as specified by step 350 of process 300. Process 500B may be used additionally or alternatively to processes 500A and 500C (described herein) in some embodiments.

At 510B a command is received that includes a first key. The command may be received from any application and/or device that is capable of using the database. Any suitable type of command may be received in some embodiments. Furthermore, any suitable type of first key may be received, in some embodiments. For example, in some embodiments, the command may be a SORT command, and the first key may be associated with a value that includes a set of references to other values (e.g., a set of second keys) that are to be sorted. Executing the command, by a database server, may include retrieving each of the values referenced by the set of second keys, sorting the values, and providing an indication of the sorted values to the application and/or device that submitted the command.

At 520B, a value that is associated with the first key is identified. As discussed above, in some embodiments, the value may be identified by using the techniques discussed in the '011 application.

At 530B, a determination is made whether the value identified at step 520B includes two or more references to other values. For example, in some embodiments, a determination may be made whether the value includes a plurality of second keys. Although in this example a determination is made whether the value includes a plurality of references to other values, in other examples the determination may be whether the command is one whose syntax requires the first key to point to a value that includes references to other values (e.g., a SORT command). Upon a negative determination, the execution of process 500B terminates. Otherwise, if it is determined that the value includes references to other values (or the command is of the predetermined type), the execution of process 500B proceeds to step 540B.

At 540B, the execution of commands, other than the command received at 510, is blocked. In some embodiments, the blocking of other commands may include refraining from executing any commands that arrive at the entity executing process 500B (e.g., DMC 200).

At 550B, for each second key (or other type of reference) that is included in the value if the first key, a value associated with that second key is identified. Any suitable method for identifying values with second keys may be used in some embodiments.

At 560B, a copy of each of the values associated with (e.g., referenced by) the second keys is obtained.

At 570B, each of the obtained copies is stored on a predetermined server.

At 580B, the blocking of the execution of commands other than the command received at 510B is stopped, and the execution of the commands is allowed to proceed.

At 590B, the instruction is forwarded to the predetermined server and subsequently executed by that server. In some embodiments, a response to the command may be received from the first server and forwarded to the application and/or device that transmitted the command.

Figure 5C:
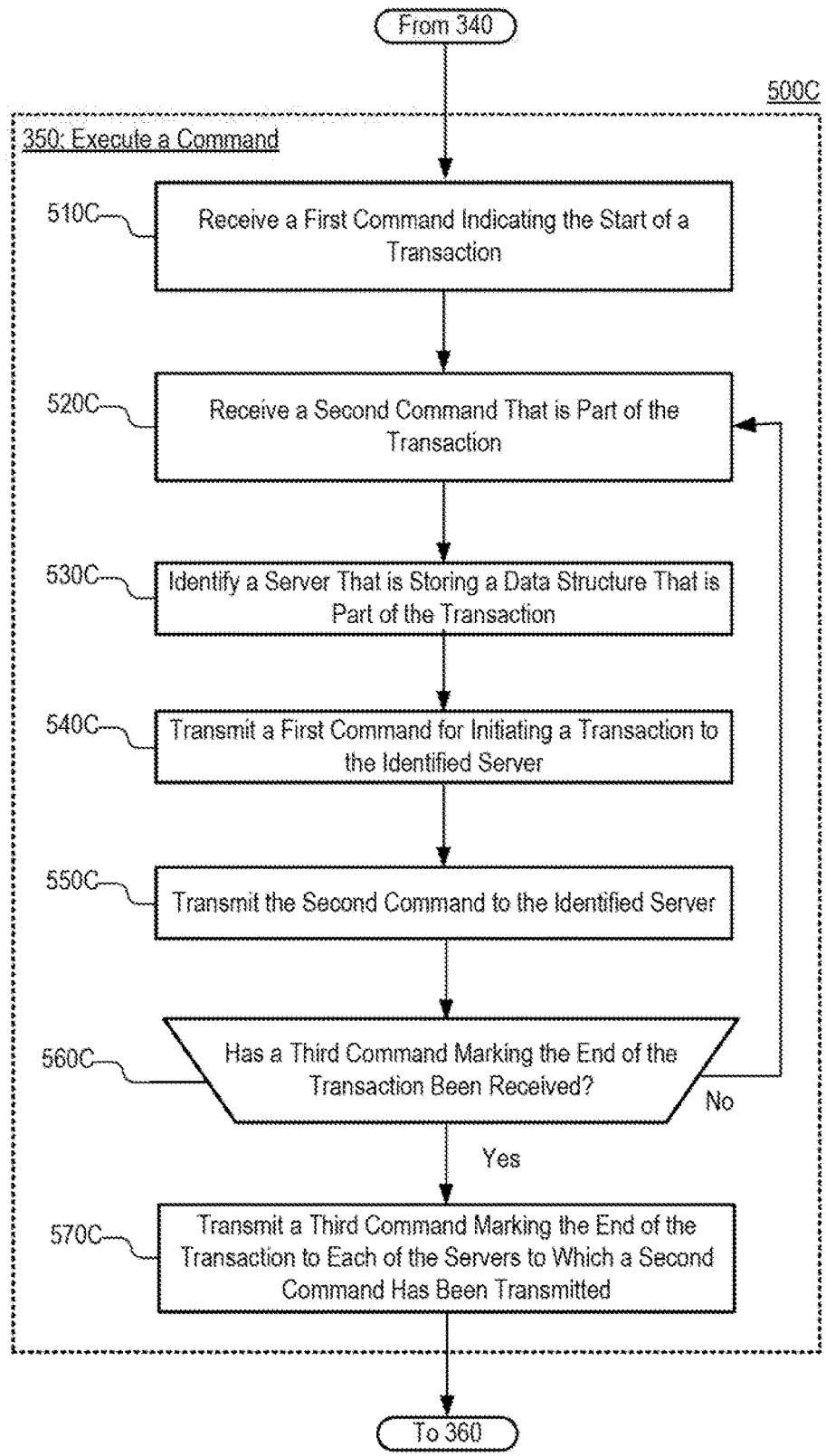
FIG. 5C is a diagram of yet another example of a process for executing database commands in accordance with some embodiments.

FIG. 5C depicts a diagram of an example of a process 500C for executing database commands in accordance with some embodiments of the disclosed subject matter. In some embodiments, process 500C may be used to execute one or more commands as specified by step 350 of process 300. Process 500C may be used additionally or alternatively to processes 500A and 500B (described herein) in some embodiments.

At 510C a command is received indicating the start of a database transaction. Any suitable command that indicates the start of a transaction may be received in some embodiments. For example, the command may be a MULTI command.

At 520C, a second command that is part of the transaction is received. Any suitable command that can be part of a transaction may be received in some embodiments. For example, the command may be an INTERSECT command, a UNION command, a SORT command, a GET command, or a SET command. The command may include at least one key.

At 530C, a server is identified based on the key. The identified server may be one that is storing a database value that is associated with the key. Any suitable method for identifying the server may be used. For example, as discussed with respect to FIG. 5A, the key may be mapped to group ID and the group ID may be mapped to a server ID (e.g., using a hash function). Additionally or alternatively, as discussed in the '011 application, the key may be mapped to a partition ID and the partition ID may be mapped to the server ID.

At 540C, a command for initiating a transaction is transmitted to the identified server. Any suitable command for initiating a transaction may be transmitted in some embodiments. For example, a MULTI command may be transmitted. In some embodiments, the first command may be transmitted to the server only when a first command has not been transmitted during a previous iteration of steps 520C-560C.

At 550C, the second command is transmitted to the second server. Upon receiving the command, the second server may execute the command and generate a response.

At 560C, a determination is made whether a third command marking the end of the transaction started at step 510C is received. Any suitable command for ending a transaction may be received, in some embodiments. For example, an EXEC command may be received. If a third command is not received, steps 520C-540D are executed again with respect to another second command that is part of the transaction started at step 510C. Otherwise, if the third command is received, the execution of process 500C proceeds to step 570C.

At 570C, a command marking the end of a transaction is transmitted to all servers on which a transaction has been started at step 540C during various iterations of steps 520C-540C. Any suitable command for ending a transaction may be transmitted. For example, an EXEC command may be transmitted to each of the servers.

Returning to FIG. 2, DMC 202 can also be used to perform client authentication in some embodiments. Any suitable one or more client authentication mechanisms can be used. For example, Simple Authentication and Security Layer (SASL) authentication, password authentication, source IP authentication, Amazon Web Service Security Group, and/or any other suitable authentication mechanisms can be used in some embodiments.

Any suitable mechanism for identifying a server in a node can be used. For example, a server can be identified by a port number that is appended to an IP address of a node (e.g., NodeIP:ServerPort).

In accordance with some embodiments, DMC 202 can also be used to perform protocol translation. For example, in some embodiments, DMC 202 can perform a translation from a protocol used by clients/applications requesting data to a protocol used by servers 206. More particularly, for example, a client/application can request data using Memcached ASCII, Memcached binary, Redis old protocol, Redis unified protocol, and/or any other suitable protocol. Servers 206 can communicate using a Redis unified protocol modified to include extensions that allows the servers to support operations which are natively not supported by a Redis server (e.g., Memcached commands) without breaking the Redis unified protocol semantics. And DMC 202 can perform a translation between these protocols.

For example, in accordance with some embodiments, DMC 202 can perform translation between the Memcached protocol and a modified Redis unified protocol. In doing so, the following can be performed. First, a client may issue a Memcached cas command using the following format: cas <key> <flags> <exptime> <bytes> <cas unique> [noreply] \r\n. Note that cas is a check and set operation, which means "store this data but only if no one else has updated since I last fetched it." This command can then be translated to a new command, RCAS, using the following format: RCAS <key> <flags> F(<exptime>) <cas unique> <bytes/body>.

In doing so, the DMC can perform the following steps when translating a Memcached cas command received from the client to the new RCAS command. If a noreply argument is used by the client, the DMC does not forward this argument to the server. Instead the DMC remembers that the initial request included this option, and therefore will not transfer the Redis reply to the client. If Memcached expiration time (exptime) uses Unix time format, the DMC can translate the Unix time to offset in seconds from the current time. The DMC can then receive a response to the RCAS command as follows. A "+OK\r\n" response can be received, which indicates success. A "-NOT_STORED" response can be received, which indicates that the data was not stored, but not because of an error. A "-EXIST" response can be received, which indicates that the item trying to be stored with the RCAS command has been modified since it was last fetched. A "-NOT_FOUND\r\n" response can be received, which indicates that the item trying to be stored with a RCAS command did not exist or has been deleted. These received messages can then respectively be translated to "STORED\r\n", "NOT_STORED", "EXIST\r\n", and "NOT_FOUND" of the Memcached protocol.

DMC 202 can also perform load balancing in some embodiments to balance loads among a master server 206 (which can respond to read and write requests for values) for a database (or bucket) partition and one or more slave servers 206 (which can respond to read requests for data objects) for the same partition. For example, in some embodiments, the DMC for a partition that resides over multiple servers 206 (e.g., one master server and N (zero or more) slave servers), can redirect a request for a data object on that partition to a relevant least used server 206 based on shared usage statistics.

Figure 6:
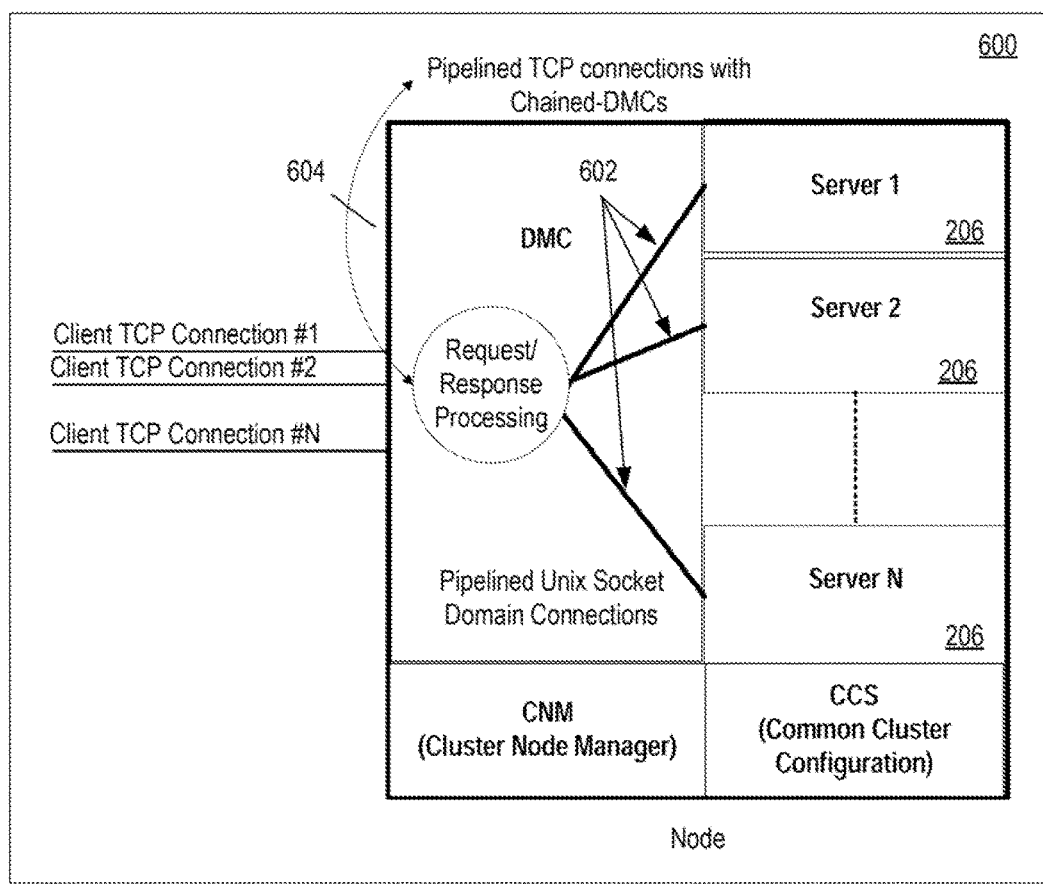
FIG. 6 is a diagram of an example of a connection between a data management controller and servers and other data management controllers in accordance with some embodiments.

In some embodiments, DMC 202 can redirect requests to and responses from a node on which a data object is stored when a request for that data object is received at the wrong node. In some embodiments, this redirection of responses can occur via dedicated connections 604 to one or more other DMCs in other nodes as shown in FIG. 6 or one or more servers in other nodes.

To improve the performance of servers 206, DMC 202 can perform connection pooling in some embodiments. Any suitable technique for connection pooling can be used in some embodiments. For example, as shown in FIG. 6, in some embodiments, the DMC can maintain a number of connections 602 with each server 206 so that each addition or removal of a connection from a server will degrade its throughput and increase its latency. In some embodiments, connections 602 between a DMC 202 and servers 206 can be long-lived, persistent connections that reduce the overhead associated with connection setup and teardown between client and server.

To improve the performance of servers 206, DMC 202 can additionally or alternatively use Unix domain socket connections between the DMC and the servers in some embodiments. When the DMC and the server reside on the same physical/virtual machine, Unix domain socket connections can be used to eliminate the processing overhead associated with managing TCP connection between the DMC and the servers.

To improve the performance of servers 206, DMC 202 can additionally or alternatively perform request pipelining in some embodiments. Requests can be pipelined by the DMC by sending multiple requests to the same server before responses to the earlier of those requests are received from the server on requests that were previously sent on the same connection.

In some embodiments, the number of connections and the size of a pipeline between DMC 202 and each server 206 can additionally or alternatively be changed based on the average object size in the server. For example, in some embodiments, when the average object size in a server is less than 1 kB, the DMC may open fewer (or reduce the number of) persistent connections with the server and increase the pipeline size (i.e., the number of requests that can be sent to the server without waiting for its response). However, when the average file size is over 20 kB, for example, the DMC may increase the number of persistent connections with the server and reduce the pipeline size.

In some embodiments, the DMC can additionally or alternatively prioritize light processing requests over heavy processing requests coming from different client connections. Any suitable basis for selecting a processing request as being light or heavy can be used in some embodiments. For example, a Redis GET request can be considered to be a light request, where as a Redis ZRANGEBYSCORE request can be considered to be a heavy request.

In some embodiments, the DMC can additionally or alternatively send the same response to multiple requesters when a read request for a data object is received while another read request for the same data object has already been sent by the DMC to a server, but a corresponding response not received. In doing so, the DMC can queue one or more later requests until the response for the first request is received. The DMC can then send that response to the client that sent the first request and to all the clients with queued requests.

In some embodiments, the DMC can additionally or alternatively provide a cache for frequently requested data objects. In some embodiments, the frequently requested objects can be more frequently requested than the frequently requested objects similarly replicated across servers 206 as described below.

In accordance with some embodiments, data management controller (DMC) 202 can be used to manage the data flow of node 200, to manage the data flow between node 200 and one or more other nodes in the same cluster, and to manage the data flow between node 200 and one or more nodes in another cluster.

In accordance with some embodiments, Cluster Node Manager CNM 204, as a cluster manager can make auto-sharding (scaling-out) decisions when a specific database (or Bucket) has to be split over more than one server due to load or memory constraints. This can be accomplished in any suitable manner. For example, the CNM can instruct a server to send one or more user data set partitions to a new server, and then the CNM can instruct the DMC to redirect requests destined to this partition(s) to the new server. Similarly, in some embodiments, CNM 204 as a cluster manager can make auto-merging (scaling-in) decisions when a specific database (or Bucket) has to be merged from two or more servers to fewer servers due to reduced load or a reduction in memory size. This can be accomplished in any suitable manner. For example, the CNM can instruct a server to send one or more user data set partitions to a target server that already manages a portion of the user data set, and then the CNM can instruct the DMC to redirect requests destined to this partition(s) to the target server.

In accordance with some embodiments, cluster node manager (CNM) 204 can be used to perform node management functions and cluster management functions. For example, the cluster node manager can be used to monitor the status of each node, configure the node, control inter- and intra-node communications, elect nodes for aggregation and supervision functions, and provide a management interface for the cluster operation.

In accordance with some embodiments, CNM 204 as a node manager can monitor for failures and/or degraded status in other nodes and in servers of its own node. Any suitable mechanism can be used for determining that another node or server has failed or become degraded in some embodiments. For example, in some embodiments, periodic messages can be sent out by each server in a node to the CNM of the node. The CNM can detect a failure when a message is missing. As another example, in some embodiments, each CNM can send out a periodic message to CNM(s) in one or more other nodes. The CNM(s) in the one or more other nodes can detect a failure when this message is missing. As yet another example, each server can send out a memory fragmentation status message to the CNM in the same node to alert the CNM if its performance has become degraded. Any suitable action can be taken in response to a failure or degraded status. For example, in some embodiments, a CNM can cause a server or another node to restart its software upon a failure being detected, to perform a de-fragmentation process upon a degraded status being detected, etc. In some embodiments, when the fragmentation ratio crosses a pre-defined threshold, the following can be performed: (1) another server on the same node or on a different node can be started; (2) the fragmented server can be backed-up; (3) all clients can be switched to the new server; and (4) the fragmented server can be released.

In some embodiments, CNM 204 as a node manager can receive, process, and monitor local configuration data, and/or monitor and collect node statistics, such as DMC statistics and server statistics.

In some embodiments, CNM 204 as a node manager can translate server statistics to other non-relational database statistics. For example, when a Memcached user asks to get his/her Memcached statistics for the user's server 206 that is based on a Redis server, the request can be forwarded to the relevant node that contains the user's server 206 that holds the user dataset, and the CNM in that node can process this request and translate the Redis statistics to Memcached statistics.

In some embodiments, CNM 204 as a node manager can provide statistics information to other components upon request.

In some embodiments, CNM 204 as a node manager can monitor the DMC and server(s) for performance alerts. For example, the CNM as a node manager can monitor cases where the throughput or the latency of the node or the server crosses pre-defined thresholds.

In some embodiments, CNM 204 as a node manager can control the load of the replication processes across the servers which reside on the same node, and control the multi-cluster replication operation of the server(s) within a node.

In some embodiments, CNM 204 as a cluster manager can manage cluster configuration by communicating with another CNM designated as a Node Configuration Manager for allocating and releasing resources.

In some embodiments, CNM 204 as a cluster manager can update the cluster DNS servers with any configuration change of the database (or Bucket). These updates can be used to ensure that only one protocol hop will be used between the clients and the cluster nodes in some embodiments.

In some embodiments, CNM 204 as a cluster manager can maintain a global configuration map that maps of all users datasets (e.g., databases or Buckets) with their partitions to cluster nodes and servers. In some embodiments, when the CNM receives a request to create a user dataset, or receives a request to increase the size of a user dataset, the CNM can perform an admission control process which will look for additional resources over existing nodes of a cluster or alternatively will add a new node to the cluster. In some embodiments, when the CNM receives a request to delete a user dataset, or receives a request to decrease the size of a user data set, the CNM can perform an admission control process which will release the resources.

In some embodiments, CNM 204 as a cluster manager can maintain a global rebalancing process in order to ensure that all resources of a cluster are spread equally across nodes.

In some embodiments, CNM 204 as a cluster manager can forward monitoring requests from the system manager to the proper CNM and aggregate statistics from multiple servers that serve the same database (or Bucket). Information about levels of utilization of the servers 206 can be exchanged between cluster node managers (CNM) 204 in different nodes.

In some embodiments, CNM 204 as a cluster manager, together with the relevant another CNM designated as a Node Replication Controller, can perform cross-clusters replication operations.

In some embodiments, DMC 202 and CNM 204, each of which is a control process, can be combined to form a combined control process.

In some embodiments, server(s) 206 can be used to provide in-memory non-relational database functionality and any other suitable server process(es). In some embodiments, the server(s) can be based on the open-source Redis server with enhanced functionality. In some embodiments, the server(s) can represent one of the following options: (1) a Memcached Bucket; (2) a partition of a Memcached Bucket; (3) a Redis database (DB); or (4) a partition of a Redis DB.

In some embodiments, each cluster's node includes N servers, and there can be any suitable number of servers, including zero, in some embodiments.

In some embodiments, in addition to functionality performed by a Redis server, server 206 can also support data operations which are not natively supported by a Redis server, such as cas and prepend commands and flag and cas arguments of Memcached. Commands and arguments which are not natively supported by the Redis server are transmitted to server 206 using the extension(s) of the modified Redis unified protocol, which extends the supported Redis command while preserving Redis unified protocol semantics. Server 206 supports these extensions by adding new elements to the object key data structure and by implementing the command logic behind the new commands. Examples for the new elements that are added to the Redis Object Key Data Structure are:

i. flags field: to support the Memcached flag functionality; and ii. cas field: to support the Memcached cas functionality.

We don't really need to compression stuff here but I have no issue with leaving it In some embodiments, in addition to functionality performed by a Redis server, the server can also perform real-time (or near real-time) class-based compression. In order to perform this compression, in some embodiments, a set of global dictionaries for finding duplicated strings across multiple objects can be provided. These dictionaries can treat all the non-relational objects that belong to a certain class as a one big object. As a result, an object can be compressed based on many data patterns which appeared in objects previously processed by the compression process.

Any suitable compression dictionaries can be used in some embodiments. For example, the compression dictionaries can be a LZW/LZ78 dictionary, a LZP dictionary, or any other suitable compression dictionary.

These dictionaries can be saved globally and can be not attached to each object, which provides additional reduction in the size of each compressed object, in some embodiments.

In some embodiments, a classification mechanism can be used to classify objects according to data patterns that were found in the objects and can provide a dedicated global dictionary per object class. This mechanism can find new classes of objects and merge classes of objects. As a result, the total size of each compression dictionary can be reduced, which contributes to additional enhancement in the compression ratio.

In some embodiments, in addition to functionality performed by a Redis server, a real-time (or near real-time) compaction mechanism for cached objects can be provided. In some embodiments, this compaction mechanism can delete cached objects immediately (or a soon after) after they have been expired.

In some embodiments, in addition to functionality performed by a Redis server, a mechanism for storing frequently used objects in a partition that is replicated across multiple nodes can be provided. In this way, multiple nodes can each serve the frequently used objects simultaneously thus improving performance. In some embodiments, these frequently used objects can always be stored in an uncompressed format.

In accordance with some embodiments, CCS 208 is an internal cluster repository service (based on the Redis architecture). In some embodiments, this service can include a per-node and a per-cluster configuration, statistics, and alert information. All the nodes in a cluster can be synchronized with the per-cluster configuration. The DMC and CNM can be registered to the CCS to receive configuration change events which are relevant to their operations.

As shown in FIG. 1, in accordance with some embodiments, each cluster can include one or more Backup Nodes 112.

In some embodiments, the cluster architecture described herein can be provided as a service. A user of this service can be registered through the service manager (SM), which communicates with a CNM designated as a Cluster Orchestrator to allocate user resources in the cluster. In some embodiments, the SM may allocate resources across multiple clusters.

In some embodiments, a user resource can be a Memcached Bucket, a Redis database (DB), or any other suitable non-relational database. Each database (or bucket) can be hosted over one or more servers 206, depending on the transaction load imposed and the memory size of its dataset. In some embodiments, each database (or bucket) can be composed of multiple partitions (e.g., 4096 or any other suitable number). In some embodiments, keys can be equally spread over the different partitions by applying a hash function technique. Partition space may scaled dynamically (in or out) if necessary, using a consistent hashing algorithm.

In some embodiments, a partition in a cluster can be hosted by one master server 206, and by zero or more slave servers 206. Master servers can serve both read and write requests, and slave servers can only serve read requests, in some embodiments.

When a database (or a bucket) is created, the user can be provided with a a single DNS address or a list of DNS addresses to be used for accessing the database (or the bucket) in some embodiments. The user then needs to configure its application servers to use these addresses. This list can include DNS addresses for both master and slave servers 206 that hold the database (or the bucket). Multiple DNS addresses may point to the same server 206.

Application requests may be sent directly to the node where the key is hosted, or may be redirected to that node by another node (through the DMC).

In accordance with some embodiments, any one or more node, any one or more cluster, the service manager, and the DNS can be implemented in one or more general or special purpose devices, such as a general purpose computer, a special purpose computer, a client, a server, etc. Any of these general or special purpose devices can include any suitable components such as one or more hardware processor (each of which can be a microprocessor, digital signal processor, a controller, etc.), memory, communication interfaces, display controllers, input devices, etc. Any one or more of the connections between different components herein can be formed from any suitable communication link or combination of communication links. For example, the communication links can include the Internet, a local area network, a wide area network, a telephone network, a satellite network, a cable network, etc.

In some embodiments, any suitable computer readable media can be used for storing instructions for performing the processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

It should be noted that FIGS. 3, 4A-4C, and 5A-5C are provided as examples only. At least some of the steps of processes 300, 400A-400C, and 500A-500B may be performed in a different order than represented, performed concurrently, or omitted. It is to be understood that the processes may be executed by at least one of a processor that is part of an in-memory, NoSQL database (e.g., a processor that is part of Node 200 or any other suitable processor). In some embodiments, processes 300, 400A-400C, and 500A-500B may be executed as part of the operation of the in-memory NoSQL database.

Features of the disclosed implementations can be combined and rearranged in various ways. The provision of the examples described herein (as well as clauses phrased as "such as," "e.g.", "including" and the like) should not be interpreted as limiting the claimed subject matter to the specific examples; rather, the examples are intended to illustrate only some of many possible aspects.

Although the invention has been described and illustrated in the foregoing illustrative implementations, it is understood that the present disclosed subject matter has been made only by way of example, and that numerous changes in the details of implementation of the invention can be made without departing from the spirit and scope of the invention, which is limited only by the claims which follow.

What is claimed is:

1. A system for managing an in-memory NoSQL database, comprising:

a hardware processor that is configured to:

identify a first key associated with a first value and a second key associated with a second value as being part of a group of keys in response to determining that:
  i) the first value is stored on a first server that is part of the in-memory NoSQL database and the second value is stored on a second server that is part of the in-memory NoSQL database; and
  ii) at least one of (a) symbols of the first key and symbols of the second key both match a predetermined symbol pattern and (b) the first key and the second key have both been included in a received multi-key NoSQL database command; and
in response to identifying the first key and the second key as being part of the group of keys, cause the first value and the second value to be both stored on at least one of the first server, the second server, and a third server.

2. The system of claim 1, wherein the first key and the second key have been both determined to have been included in a received multi-key NoSQL database command and wherein identifying the first key and the second key as being part of the group of keys comprises including the first key and the second key in the group based on a count of received database commands that include both the first key and the second key.

3. The system of claim 1, wherein the first key and the second key have been both determined to have been included in a received multi-key NoSQL database command and wherein identifying the first key and the second key as being part of the group of keys comprises including the first key and the second key in the group in response to receiving a command that includes both the first key and the second key.

4. The system of claim 1, wherein the hardware processor is further configured to:
  receive a command including at least two keys;
  determine whether the at least two keys are part of the group of keys;
  in response to determining that the at least two keys are part of the group of keys, determine an identifier of the group of keys;
  identify one of the first server, the second server, the third server, and a fourth server that is part of the in-memory NoSQL database based on the identifier of the group of keys as being one in which values associated with keys from the group are stored; and
  forward the command to the one of the first server, the second server, the third server, and the fourth server.

5. The system of claim 4, wherein identifying the one of the first server, the second server, the third server, and the fourth server includes:
  mapping the identifier of the group of keys to an identifier of a partition; and
  mapping the identifier of the partition to an identifier of the one of the first server, the second server, the third server, and the fourth server.

6. The system of claim 5, wherein the mapping the identifier of the group of keys to an identifier of a partition includes performing a hash function on at least a portion of the identifier of the group of keys.

7. A method for managing an in-memory NoSQL database, comprising:
  identifying, by a hardware processor, a first key associated with a first value and a second key associated with a second value as being part of a group of keys in response to determining that:
    i) the first value is stored on a first server that is part of the in-memory NoSQL database and the second value is stored on a second server that is part of the in-memory NoSQL database; and
    ii) at least one of (a) symbols of the first key and symbols of the second key both match a predetermined symbol pattern and (b) the first key and the second key have both been included in a received multi-key NoSQL database command; and
  in response to identifying the first key and the second key as being part of the group of keys, causing the first value and the second value to be both stored on at least one of the first server, the second server, and a third server.

8. The method of claim 7, wherein the first key and the second key have been both determined to have been included in a received multi-key NoSQL database command and wherein identifying the first key and the second key as being part of the group of keys comprises including the first key and the second key in the group based on a count of received database commands that include both the first key and the second key.

9. The method of claim 7, wherein the first key and the second key have been both determined to have been included in a received multi-key NoSQL database command and wherein identifying the first key and the second key as being part of the group of keys comprises including the first key and the second key in the group in response to receiving a command that includes both the first key and the second key.

10. The method of claim 7, further comprising:
  receiving a command including at least two keys;
  determining whether the at least two keys are part of the group of keys;
  in response to determining that the at least two keys are part of the group of keys, determining an identifier of the group of keys;
  identifying one of the first server, the second server, the third server, and a fourth server that is part of the in-memory NoSQL database based on the identifier of the group of keys as being one in which values associated with keys from the group are stored; and
  forwarding the command to the one of the first server, the second server, the third server, and the fourth server.

11. The method of claim 10, wherein identifying the one of the first server, the second server, the third server, and the fourth server includes:
  mapping the identifier of the group of keys to an identifier of a partition; and
  mapping the identifier of the partition to an identifier of the one of the first server, the second server, the third server, and the fourth server.

12. The method of claim 11, wherein the mapping the identifier of the group of keys to an identifier of a partition includes performing a hash function on at least a portion of the identifier of the group of keys.

13. A non-transitory computer-readable medium containing computer-executable instructions that, when executed by a processor, cause the processor to perform a method for managing an in-memory NoSQL database, the method comprising:
  identifying a first key associated with a first value and a second key associated with a second value as being part of a group of keys in response to determining that:

i) the first value is stored on a first server that is part of the in-memory NoSQL database and the second value is stored on a second server that is part of the in-memory NoSQL database; and ii) at least one of (a) symbols of the first key and symbols of the second key both match a predetermined symbol pattern and (b) the first key and the second key have both been included in a received multi-key NoSQL database command; and in response to identifying the first key and the second key as being part of the group of keys, causing the first value and the second value to be both stored on at least one of the first server, the second server, and a third server.

14. The non-transitory computer-readable medium of claim 13, wherein the first key and the second key have been both determined to have been included in a received multi-key NoSQL database command and wherein identifying the first key and the second key as being part of the group of keys comprises including the first key and the second key in the group based on a count of received database commands that include both the first key and the second key.

15. The non-transitory computer-readable medium of claim 13, wherein the first key and the second key have been both determined to have been included in a received multi-key NoSQL database command and wherein identifying the first key and the second key as being part of the group of keys comprises including the first key and the second key in the group in response to receiving a command that includes both the first key and the second key.

16. The non-transitory computer-readable medium of claim 13, wherein the method further comprises:

receiving a command including at least two keys;

determining whether the at least two keys are part of the group of keys;

in response to determining that the at least two keys are part of the group of keys, determining an identifier of the group of keys;

identifying one of the first server, the second server, the third server, and a fourth server that is part of the in-memory NoSQL database based on the identifier of the group of keys as being one in which values associated with keys from the group are stored; and forwarding the command to the one of the first server, the second server, the third server, and the fourth server.

17. The non-transitory computer-readable medium of claim 16, wherein identifying the one of the first server, the second server, the third server, and the fourth server includes:

mapping the identifier of the group of keys to an identifier of a partition; and mapping the identifier of the partition to an identifier of the one of the first server, the second server, the third server, and the fourth server.

18. The non-transitory computer-readable medium of claim 17, wherein the mapping the identifier of the group of keys to an identifier of a partition includes performing a hash function on at least a portion of the identifier of the group of keys.

* * * * *